United States Patent
Do et al.

(10) Patent No.: US 8,669,654 B2
(45) Date of Patent: Mar. 11, 2014

(54) INTEGRATED CIRCUIT PACKAGING SYSTEM WITH DIE PADDLE AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 120 days.

(21) Appl. No.: 13/197,070

(22) Filed: Aug. 3, 2011

(65) Prior Publication Data

US 2012/0032315 A1  Feb. 9, 2012

Related U.S. Application Data

(60) Provisional application No. 61/370,452, filed on Aug. 3, 2010.

(51) Int. Cl.
H01L 23/52 (2006.01)
H01L 23/48 (2006.01)

(52) U.S. Cl.
USPC ............. 257/692; 257/E23.037; 257/676; 438/123

(58) Field of Classification Search
USPC ........... 257/E21.502, E21.506, E23.031, 676, 257/669, 672, 674, 692, 773; 438/106, 113, 438/121, 123
See application file for complete search history.

(56) References Cited

U.S. PATENT DOCUMENTS

| | | | |
|---|---|---|---|
| 5,847,458 A * | 12/1998 | Nakamura et al. | 257/738 |
| 6,348,726 B1 * | 2/2002 | Bayan et al. | 257/666 |
| 6,713,849 B2 * | 3/2004 | Hasebe et al. | 257/667 |
| 6,927,483 B1 * | 8/2005 | Lee et al. | 257/676 |
| 6,995,459 B2 * | 2/2006 | Lee et al. | 257/676 |
| 7,049,177 B1 * | 5/2006 | Fan et al. | 438/123 |
| 7,060,535 B1 * | 6/2006 | Sirinorakul et al. | 438/123 |
| 7,226,811 B1 * | 6/2007 | McLellan et al. | 438/111 |
| 7,247,526 B1 * | 7/2007 | Fan et al. | 438/123 |
| 7,683,461 B2 * | 3/2010 | Lau | 257/666 |
| 7,858,443 B2 * | 12/2010 | Powell et al. | 438/111 |
| 7,993,979 B2 * | 8/2011 | Do et al. | 438/123 |
| 8,063,470 B1 * | 11/2011 | Sirinorakul et al. | 257/666 |
| 8,203,201 B2 * | 6/2012 | Camacho et al. | 257/676 |
| 8,241,965 B2 * | 8/2012 | Bathan et al. | 438/123 |
| 8,420,508 B2 * | 4/2013 | Camacho et al. | 438/464 |
| 2007/0052070 A1 * | 3/2007 | Islam et al. | 257/666 |
| 2007/0059863 A1 | 3/2007 | Li et al. | |
| 2007/0126094 A1 * | 6/2007 | Shojaie et al. | 257/676 |
| 2007/0181983 A1 * | 8/2007 | Takai et al. | 257/666 |
| 2008/0067649 A1 * | 3/2008 | Matsunaga et al. | 257/677 |
| 2008/0258278 A1 * | 10/2008 | Ramos et al. | 257/676 |
| 2009/0230523 A1 * | 9/2009 | Chien et al. | 257/676 |
| 2009/0283882 A1 * | 11/2009 | Hsieh et al. | 257/676 |
| 2010/0044850 A1 * | 2/2010 | Lin et al. | 257/690 |
| 2010/0258921 A1 * | 10/2010 | Chang Chien et al. | 257/676 |
| 2011/0079885 A1 | 4/2011 | Camacho et al. | |
| 2011/0079886 A1 | 4/2011 | Bathan et al. | |
| 2011/0163430 A1 * | 7/2011 | Lee et al. | 257/676 |
| 2011/0201159 A1 * | 8/2011 | Mori et al. | 438/123 |
| 2012/0038036 A1 * | 2/2012 | Chun et al. | 257/677 |

* cited by examiner

*Primary Examiner* — Chris Chu
(74) *Attorney, Agent, or Firm* — Ishimaru & Associates LLP

(57) ABSTRACT

A method of manufacture of an integrated circuit packaging system includes: providing a package paddle having a single integral structure with a paddle central portion surrounded by a paddle peripheral portion; forming a terminal adjacent the package paddle; mounting an integrated circuit over the paddle central portion; and forming an encapsulation over the integrated circuit and the terminal, the encapsulation free of delamination with the encapsulation directly on the paddle peripheral portion.

20 Claims, 8 Drawing Sheets

INTEGRATED CIRCUIT PACKAGING SYSTEM WITH DIE PADDLE AND METHOD OF MANUFACTURE THEREOF

CROSS-REFERENCE TO RELATED APPLICATION(S)

This application claims the benefit of U.S. Provisional Patent Application Ser. No. 61/370,452 filed Aug. 3, 2010, and the subject matter thereof is incorporated herein by reference thereto.

TECHNICAL FIELD

The present invention relates generally to an integrated circuit packaging system, and more particularly to a system with a die paddle.

BACKGROUND ART

Modern electronics, such as smart phones, personal digital assistants, location based services devices, enterprise class servers, or enterprise-class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipment. Paradoxically, the reuse of existing manufacturing processes does not typically result in the reduction of package dimensions. The demand continues for lower cost, smaller size, and more functionality.

Thus, a need remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package paddle having a single integral structure with a paddle central portion surrounded by a paddle peripheral portion; forming a terminal adjacent the package paddle; mounting an integrated circuit over the paddle central portion; and forming an encapsulation over the integrated circuit and the terminal, the encapsulation free of delamination with the encapsulation directly on the paddle peripheral portion.

The present invention provides an integrated circuit packaging system, including: a package paddle having a single integral structure with a paddle central portion surrounded by a paddle peripheral portion; a terminal adjacent the package paddle; an integrated circuit over the paddle central portion; and an encapsulation over the integrated circuit and the terminal, the encapsulation free of delamination with the encapsulation directly on the paddle peripheral portion.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
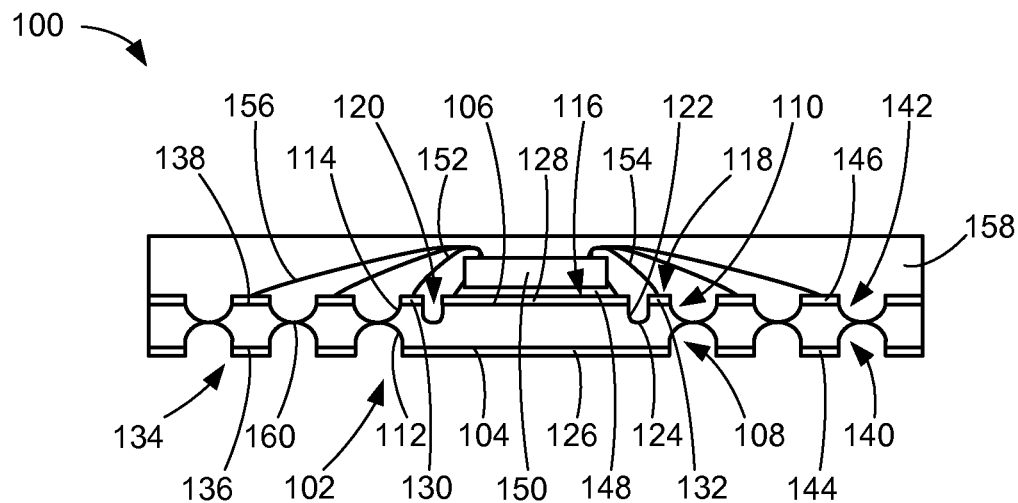
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Leadframe plating does not provide good adhesion with encapsulant or epoxy mold compounds (EMC). With plating covering all the area of a die paddle, high stressing will show that this condition is susceptible to delamination problems, i.e. micro-gaps, in the interface between paddle and EMC. Embodiments of the present invention provide solutions to the problems.

Figure 2:
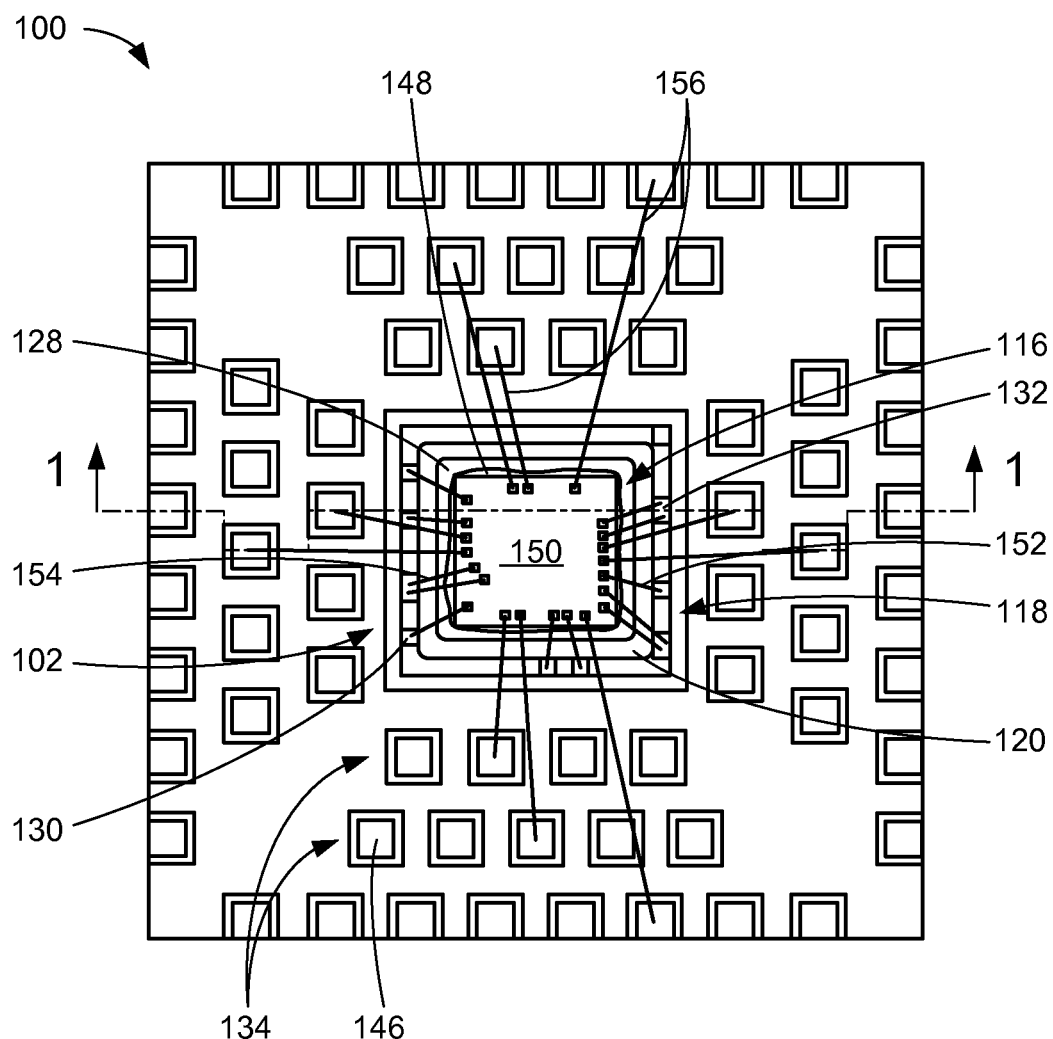
FIG. 2 is a top plan view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can represent a stand-off quad flat nolead (QFN) package with segmented plating and enhanced groove paddle design.

The integrated circuit packaging system 100 can include a package paddle 102, which is defined as a support structure for mounting and connecting an integrated circuit device thereon. The package paddle 102 is formed with a single integral structure, which is defined as a support structure entirely formed with a common and single material. The package paddle 102 can include a paddle bottom side 104 and a paddle top side 106 opposite and over the paddle bottom side 104. The package paddle 102 can represent a die paddle.

The package paddle 102 can include a paddle lower portion 108 and a paddle upper portion 110 opposite the paddle lower portion 108. The package paddle 102 can include a paddle lower non-horizontal side 112 and a paddle upper non-horizontal side 114 opposite the paddle lower non-horizontal side 112.

The paddle bottom side 104 and the paddle top side 106 define bottom and top extents of the paddle lower portion 108 and the paddle upper portion 110, respectively. The paddle lower non-horizontal side 112 and the paddle upper non-horizontal side 114 define horizontal extents of the paddle lower portion 108 and the paddle upper portion 110, respectively.

The paddle lower portion 108 can be horizontally bounded by the paddle lower non-horizontal side 112. The paddle upper portion 110 can be horizontally bounded by the paddle upper non-horizontal side 114. The paddle lower non-horizontal side 112 and the paddle upper non-horizontal side 114 can include curve surfaces including concave surfaces.

The paddle lower non-horizontal side 112 can be connected to the paddle bottom side 104 and the paddle upper non-horizontal side 114. The paddle upper non-horizontal side 114 can be connected to the paddle lower non-horizontal side 112 and the paddle top side 106. The paddle lower non-horizontal side 112 can be connected to the paddle upper non-horizontal side 114 forming a ridge, which horizontally extends away from a center of the package paddle 102.

The package paddle 102 can include a paddle central portion 116 at the paddle upper portion 110. The package paddle 102 can include a paddle peripheral portion 118, at the paddle upper portion 110, adjacent and surrounding the paddle central portion 116.

The package paddle 102 can include a groove 120, which is defined as an indentation of the package paddle 102, at the paddle top side 106. The groove 120 can be horizontally bounded by a groove sidewall 122 and vertically bounded by a groove bottom side 124. The groove 120 can be between the paddle central portion 116 and the paddle peripheral portion 118.

The groove 120 provides spacing between the groove bottom side 124 and the paddle top side 106. The groove 120 provides spacing between the paddle central portion 116 and the paddle peripheral portion 118. The groove 120 can represent a U-shape opening, as depicted in the cross-sectional view.

The package paddle 102 can include an external conductive layer 126, which is defined as a conductor that provides electrical connectivity between the package paddle 102 and an external system (not shown). The external conductive layer 126 can be formed directly on the paddle bottom side 104.

The package paddle 102 can include a central conductive layer 128, which is defined as a conductor that provides attachment support between the package paddle 102 and the integrated circuit device. The central conductive layer 128 can be formed directly on the paddle central portion 116 at the paddle top side 106.

The package paddle 102 can include a first selective conductive layer 130 and a second selective conductive layer 132, which are defined as conductors that provide electrical connectivity between the package paddle 102 and the integrated circuit device. The first selective conductive layer 130 and the second selective conductive layer 132 can be formed directly on the paddle peripheral portion 118 at the paddle top side 106. The first selective conductive layer 130 and the second selective conductive layer 132 can be adjacent and around the central conductive layer 128.

The integrated circuit packaging system 100 can include terminals 134, which are defined as connectors providing electrical connectivity between the integrated circuit device and the external system. The terminals 134 can be formed adjacent and surrounding the package paddle 102.

The terminals 134 can be electrically isolated from the package paddle 102. Each of the terminals 134 can include a terminal bottom side 136 and a terminal top side 138. Each of the terminals 134 can include a terminal lower portion 140 and a terminal upper portion 142.

Each of the terminals 134 can include a terminal bottom conductive layer 144, which is defined as a conductor that provides electrical connectivity between each of the terminals 134 and the external system. The terminal bottom conductive layer 144 can be formed directly on the terminal bottom side 136 at the terminal lower portion 140.

Each of the terminals 134 can include a terminal top conductive layer 146, which is defined as a conductor that provides electrical connectivity between each of the terminals 134 and the integrated circuit device. The terminal top conductive layer 146 can be formed directly on the terminal top side 138 at the terminal upper portion 142.

The paddle bottom side 104 and the terminal bottom side 136 can be coplanar with each other. The external conductive layer 126 and the terminal bottom conductive layer 144 can be coplanar with each other. The paddle top side 106 and the terminal top side 138 can be coplanar with each other. The central conductive layer 128, the first selective conductive layer 130, the second selective conductive layer 132, and the terminal top conductive layer 146 can be coplanar with each other.

The integrated circuit packaging system 100 can include an attach layer 148, which is defined as a die attach material or an adhesive material. The integrated circuit packaging system 100 can include an integrated circuit 150, which is defined as a semiconductor device, having an inactive side attached to the central conductive layer 128 with the attach layer 148. The integrated circuit 150 can be mounted with the inactive side facing the paddle central portion 116. The integrated circuit 150 can be mounted on the paddle top side 106.

The integrated circuit packaging system 100 can include a first paddle-device connector 152, a second paddle-device connector 154, and terminal-device connectors 156, which are defined as electrical connectors. Examples of the first paddle-device connector 152, the second paddle-device connector 154, and the terminal-device connectors 156 can be bond wires, ribbon bond wires, or reserve stand-off stitch bond wires.

The first paddle-device connector 152 can be attached to an active side of the integrated circuit 150 and the first selective conductive layer 130. The second paddle-device connector 154 can be attached to the active side and the second selective conductive layer 132. Each of the terminal-device connectors 156 can be connected to the active side and the terminal top conductive layer 146.

The integrated circuit packaging system 100 can include an encapsulation 158, which is defined as a package cover of a semiconductor package that seals an integrated circuit device providing mechanical and environmental protection. The encapsulation 158 can be formed over the package paddle 102, the terminals 134, the attach layer 148, the integrated circuit 150, the first paddle-device connector 152, the second paddle-device connector 154, and the terminal-device connectors 156.

The encapsulation 158 can cover the paddle upper portion 110 and the terminal upper portion 142. The encapsulation 158 can be within the groove 120 covering the groove sidewall 122 and the groove bottom side 124.

The encapsulation 158 can expose the paddle lower portion 108 and the terminal lower portion 140. The encapsulation 158 can include an encapsulation bottom side 160, from which the paddle lower portion 108 and the terminal lower portion 140 can vertically extend.

The encapsulation 158 can be formed directly on the paddle upper non-horizontal side 114, the groove sidewall 122, the groove bottom side 124, and any portions of the paddle peripheral portion 118 at the paddle top side 106 that are not plated with other layers of conductors, depicted as the first selective conductive layer 130 and the second selective conductive layer 132.

The encapsulation 158 can be formed free of delamination. The term "free of delamination" is defined as lack or absence of micro-gaps between the encapsulation 158 and the paddle upper portion 110 including the paddle upper non-horizontal side 114, the groove sidewall 122, the groove bottom side 124, and any portions of the paddle peripheral portion 118 at the paddle top side 106 that are not plated or covered with other layers of conductors, which include the first selective conductive layer 130 and the second selective conductive layer 132.

It has been discovered that the package paddle 102 improves reliability by providing additional surface areas of copper, as an example, with the paddle upper non-horizontal side 114 and within the groove 120 including the groove sidewall 122 and the groove bottom side 124 for the encapsulation 158 to form directly thereon free of delamination thereby eliminating paddle detachment since the package paddle 102 is formed with a material that adheres better to the encapsulation 158 than other conductors to the encapsulation 158.

It has been unexpectedly found that the paddle upper non-horizontal side 114 having a curve or concave surface covered by the encapsulation 158 improves paddle interlocking resulting in improved reliability.

Referring now to FIG. 2, therein is shown a top plan view of the integrated circuit packaging system 100. The top plan view is shown without the encapsulation 158 of FIG. 1. The top plan view depicts the package paddle 102 surrounded by multiple rows of the terminals 134.

The package paddle 102 can include the paddle central portion 116 surrounded by the paddle peripheral portion 118. The package paddle 102 can include the groove 120 between the paddle central portion 116 and the paddle peripheral portion 118.

The package paddle 102 can include the central conductive layer 128 formed at the paddle central portion 116. The integrated circuit packaging system 100 can include the first selective conductive layer 130 and the second selective conductive layer 132 formed within a perimeter of the paddle peripheral portion 118. The integrated circuit packaging system 100 can include the terminal top conductive layer 146 within a perimeter of each of the terminals 134.

The integrated circuit packaging system 100 can include the integrated circuit 150 attached to the central conductive layer 128 with the attach layer 148. The integrated circuit packaging system 100 can include the terminal-device connectors 156 connected to the integrated circuit 150 and a number of the terminal top conductive layer 146.

The integrated circuit packaging system 100 can include the first paddle-device connector 152 connected to the integrated circuit 150 and the first selective conductive layer 130. The integrated circuit packaging system 100 can include the second paddle-device connector 154 connected to the integrated circuit 150 and the second selective conductive layer 132.

For example, the first selective conductive layer 130 and the second selective conductive layer 132 can represent ground bond wire terminals or flat regions. Also for example, the first selective conductive layer 130 and the second selective conductive layer 132 can represent segment plating since the first selective conductive layer 130 and the second selective conductive layer 132 are physically separated from each other and from other conductive layers in the paddle peripheral portion 118.

It has been discovered that the package paddle 102 improves reliability by providing additional surface areas with portions of the paddle peripheral portion 118 that are not plated with other layers of conductors for the encapsulation 158 to form directly thereon free of delamination thereby eliminating paddle detachment since the package paddle 102 is formed with a material that adheres better to the encapsulation 158 than other conductors to the encapsulation 158.

Figure 3:
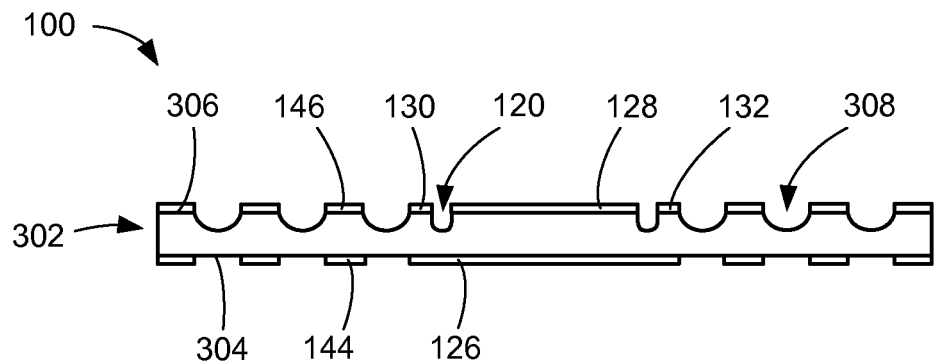
FIG. 3 is a cross-sectional view of the integrated circuit packaging system in a leadframe-providing phase of manufacture.

Referring now to FIG. 3, therein is shown a cross-sectional view of the integrated circuit packaging system 100 in a leadframe-providing phase of manufacture. The integrated circuit packaging system 100 can include a leadframe 302, which is defined as a structure providing support and connectivity for the integrated circuit device.

The leadframe 302 can include a leadframe bottom side 304 and a leadframe top side 306. The leadframe 302 can include a partially removed region 308 extending below the leadframe top side 306. The leadframe 302 can include the groove 120 at the leadframe top side 306 and vertically partially through the leadframe 302.

The leadframe 302 is made of a material to which an encapsulant adheres or bonds well. For example, the leadframe 302 is formed with a conductive material including bare copper (Cu) or any other metallic material.

The leadframe bottom side 304 and the leadframe top side 306 can be selectively plated to form the external conductive layer 126, the terminal bottom conductive layer 144, the central conductive layer 128, the first selective conductive layer 130, the second selective conductive layer 132, and the terminal top conductive layer 146. The integrated circuit packaging system 100 can include the external conductive layer 126 and the terminal bottom conductive layer 144 formed directly on the leadframe bottom side 304. The integrated circuit packaging system 100 can include the central conductive layer 128, the first selective conductive layer 130, the second selective conductive layer 132, and the terminal top conductive layer 146 formed directly on the leadframe top side 306.

The external conductive layer 126, the terminal bottom conductive layer 144, the central conductive layer 128, the first selective conductive layer 130, the second selective conductive layer 132, and the terminal top conductive layer 146 are formed with a material to which the encapsulant adheres or bonds less well than a material of the leadframe 302. The external conductive layer 126, the terminal bottom conductive layer 144, the central conductive layer 128, the first selective conductive layer 130, the second selective conductive layer 132, and the terminal top conductive layer 146 can be formed by a process including selective plating or patterning. For example, patterns of plating on the leadframe bottom side 304 to form the external conductive layer 126 and the terminal bottom conductive layer 144 can be different from patterns of plating on the leadframe top side 306 to form the central conductive layer 128, the first selective conductive layer 130, the second selective conductive layer 132, and the terminal top conductive layer 146.

For example, the external conductive layer 126, the terminal bottom conductive layer 144, the central conductive layer 128, the first selective conductive layer 130, the second selective conductive layer 132, and the terminal top conductive layer 146 can include a conductive material including a metallic material or a metal alloy. For a specific example, the conductive material can include silver (Ag), nickel-palladium (NiPd), nickel-palladium-gold (NiPdAu), gold-silver (AuAg), or other conductive materials capable of being deposited by plating methods. Since etching can be used to form various structures in different embodiments of the present invention, in those embodiments, the conductive material can include a plated material or an etch-resistant material.

The groove 120 and the partially removed region 308 can be formed by a removal process including etching or half-etching. The groove 120 can be formed by removing a portion of the leadframe 302 at the leadframe top side 306 between the central conductive layer 128 and the first selective conductive layer 130 and between the central conductive layer 128 and the second selective conductive layer 132. The partially removed region 308 can be formed by removing a portion of the leadframe 302 between the first selective conductive layer 130 and the terminal top conductive layer 146, between the second selective conductive layer 132 and the terminal top conductive layer 146, and between the terminal top conductive layer 146 and another of the terminal top conductive layer 146.

Figure 4:
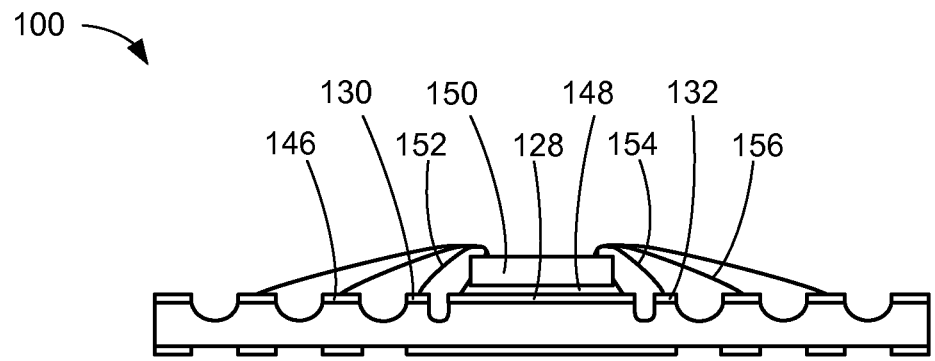
FIG. 4 is the structure of FIG. 3 in a connecting phase.

Referring now to FIG. 4, therein is shown the structure of FIG. 3 in a connecting phase. The integrated circuit packaging system 100 can include an attach process including die attach to attach the integrated circuit 150 to the central conductive layer 128 with the attach layer 148.

The integrated circuit packaging system 100 can include a connection process including wire bonding to attach the first paddle-device connector 152 and the second paddle-device connector 154 to the integrated circuit 150 and the first selective conductive layer 130 and the second selective conductive layer 132, respectively. The connection process can also be performed to attach the terminal-device connectors 156 to the integrated circuit 150 and the terminal top conductive layer 146. For example, the first paddle-device connector 152 and the second paddle-device connector 154 can represent ground bonds or ground wires.

Figure 5:
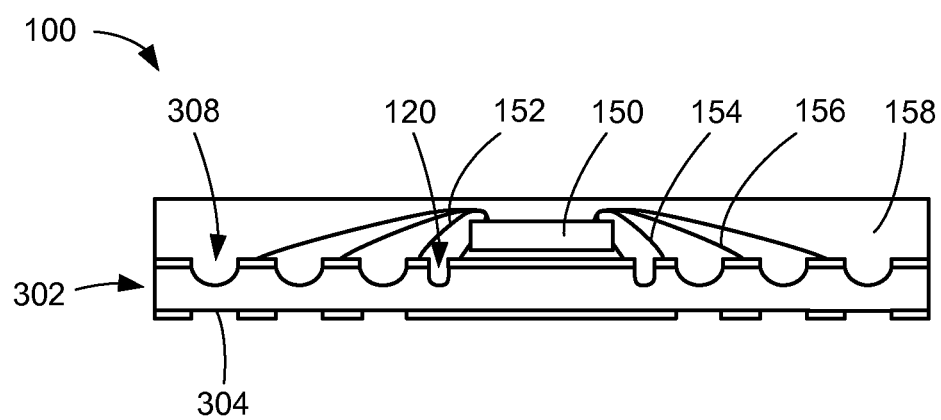
FIG. 5 is the structure of FIG. 4 in a removal phase.

Referring now to FIG. 5, therein is shown the structure of FIG. 4 in a removal phase. The encapsulation 158 can be molded over the integrated circuit 150, the first paddle-device connector 152, the second paddle-device connector 154, and the terminal-device connectors 156. The encapsulation 158 can be formed within the groove 120 and the partially removed region 308. The encapsulation 158 can be formed with a molding material including an epoxy molding compound or an encapsulant.

Portions of the leadframe 302 exposed at the leadframe bottom side 304 can be removed with a removal process including bottom etching. Island terminals, depicted as the terminals 134 of FIG. 1, and the package paddle 102 of FIG. 1 can be formed after the removal process. The terminals 134 and the package paddle 102 can be electrically isolated from each other. Singulation can be performed after the removal process to form individual units of the integrated circuit packaging system 100.

Figure 6:
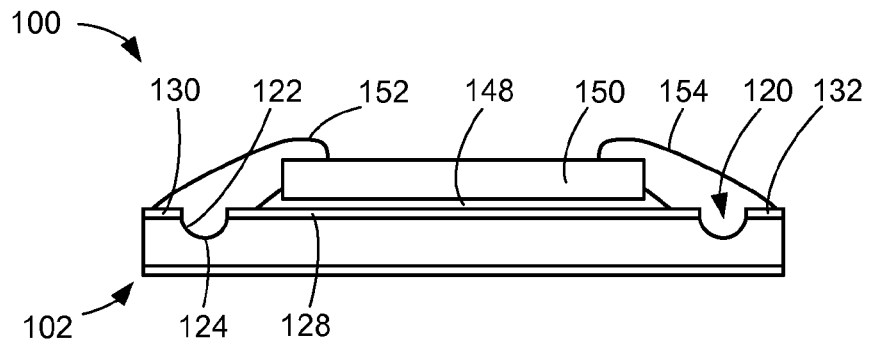
FIG. 6 is a cross-sectional view of the integrated circuit packaging system taken along line 6-6 of FIG. 7.
Figure 7:
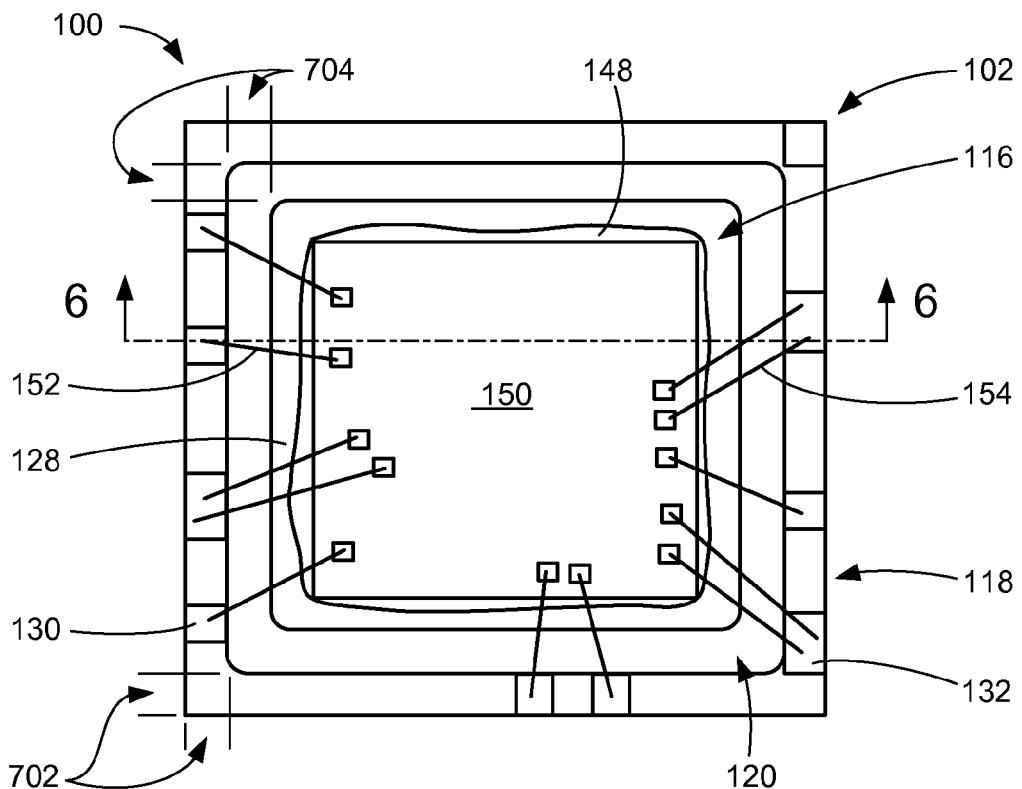
FIG. 7 is a top plan view of a portion of the integrated circuit packaging system.

Referring now to FIG. 6, therein is shown a cross-sectional view of the integrated circuit packaging system 100 taken along line 6-6 of FIG. 7. The cross-sectional view is shown without the encapsulation 158 of FIG. 1.

The cross-sectional view depicts the integrated circuit 150 mounted over the package paddle 102 with the attach layer 148 attached to the integrated circuit 150 and the central conductive layer 128. The first paddle-device connector 152 and the second paddle-device connector 154 can be attached to the integrated circuit 150 and the first selective conductive layer 130 and the second selective conductive layer 132, respectively.

The groove 120 can be between the central conductive layer 128 and the first selective conductive layer 130 and between the central conductive layer 128 and the second selective conductive layer 132. The groove 120 can be horizontally bounded by the groove sidewall 122 and vertically bounded by the groove bottom side 124. The groove sidewall 122 can include a curve or concave surface.

It has been discovered that the groove sidewall 122 having a curve or concave surface covered by the encapsulation 158 improves paddle interlocking resulting in improved reliability.

Referring now to FIG. 7, therein is shown a top plan view of a portion of the integrated circuit packaging system 100. The top plan view is shown without the encapsulation 158 of FIG. 1.

The package paddle 102 can include the paddle central portion 116 surrounded by the paddle peripheral portion 118. The package paddle 102 can include the groove 120 between the paddle central portion 116 and the paddle peripheral portion 118.

The package paddle 102 can include the central conductive layer 128 formed within a perimeter of the paddle central portion 116. The groove 120 can be formed around the perimeter of the central conductive layer 128. The package paddle 102 can include the first selective conductive layer 130 and the second selective conductive layer 132 formed within a perimeter of the paddle peripheral portion 118.

The integrated circuit packaging system 100 can include the integrated circuit 150 attached to the central conductive layer 128 with the attach layer 148. The integrated circuit packaging system 100 can include the first paddle-device connector 152 and the second paddle-device connector 154, which can represent ground wires, connected or bonded to different plated segmented portions of the die paddle, depicted as the first selective conductive layer 130 and the second selective conductive layer 132.

The first selective conductive layer 130 and the second selective conductive layer 132 are formed to provide connection areas just for attaching the first paddle-device connector 152 and the second paddle-device connector 154, respectively, thereby leaving other surface areas of the paddle peripheral portion 118 exposed for the encapsulation 158 to form thereon. The first paddle-device connector 152 can be connected to the integrated circuit 150 and the first selective conductive layer 130.

The second paddle-device connector 154 can be connected to the integrated circuit 150 and the second selective conductive layer 132. Another of the second paddle-device connector 154 can be connected to the integrated circuit 150 and the second selective conductive layer 132.

The package paddle 102 can include the groove 120 upwardly exposing a material of the package paddle 102, which adheres well with a material of the encapsulation 158, in order to eliminate delamination or micro-gaps between the package paddle 102 and the encapsulation 158. For example, the package paddle 102 can represent a non-delaminating die paddle.

The first selective conductive layer 130 can be isolated and different from the second selective conductive layer 132. The first selective conductive layer 130 can include a length less than a length of the second selective conductive layer 132. The first selective conductive layer 130 can include a width approximately equal to a width of the second selective conductive layer 132. For illustrative purposes, the first selective conductive layer 130 and the second selective conductive layer 132 are shown as a square and a rectangle, respectively, although it is understood that the first selective conductive layer 130 and the second selective conductive layer 132 can include any other shapes.

The paddle peripheral portion 118 can include a peripheral width 702, which is defined as a distance between an outer extent of the package paddle 102 and an outer extent of the groove 120. For example, the peripheral width 702 can be approximately 0.2 millimeter (mm). The first selective conductive layer 130 and the second selective conductive layer 132 can include widths approximately equal to the peripheral width 702.

The groove 120 can include a groove width 704, which is defined as a distance between an inner extent of the paddle peripheral portion 118 and an outer extent of the paddle central portion 116. For example, the groove width 704 can include an approximate range of 0.15 mm to 0.18 mm.

It has been discovered that the package paddle 102 improves reliability by providing additional surface areas within the groove 120 for the encapsulation 158 to form directly thereon free of delamination thereby eliminating paddle detachment since the package paddle 102 is formed with a material that adheres better to the encapsulation 158 than other conductors to the encapsulation 158.

It has been unexpectedly found that the package paddle 102 having the first selective conductive layer 130 and the second selective conductive layer 132 formed in multiple segments provides improved reliability since the first selective conductive layer 130 and the second selective conductive layer 132 are separate from each other leaving other surface areas of the paddle peripheral portion 118 exposed for the encapsulation 158 to form thereon thereby improving paddle interlocking.

Figure 8:
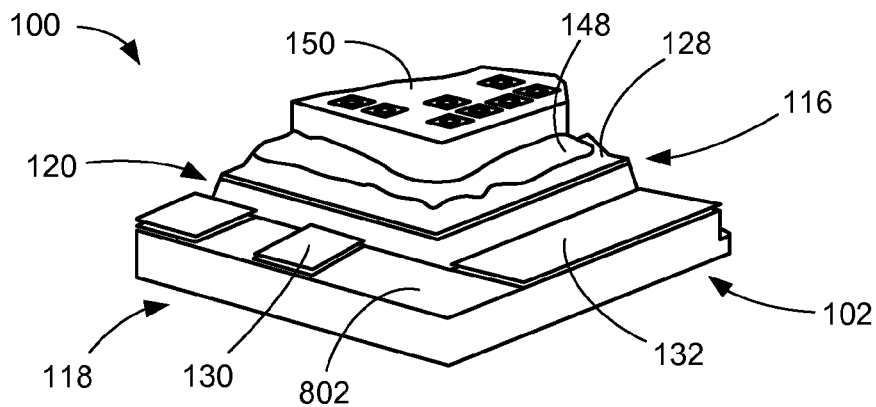
FIG. 8 is a top isometric view of a portion of the integrated circuit packaging system.

Referring now to FIG. 8, therein is shown a top isometric view of a portion of the integrated circuit packaging system 100. The top isometric view is shown without the encapsulation 158 of FIG. 1. The integrated circuit packaging system 100 is shown with the package paddle 102 having the paddle central portion 116 surrounded by the paddle peripheral portion 118 with the groove 120 between thereof.

The package paddle 102 can include the central conductive layer 128 directly on the paddle central portion 116. The central conductive layer 128 can provide mounting support for the integrated circuit 150 attached thereto with the attach layer 148. The package paddle 102 can include a number of the first selective conductive layer 130 and the second selective conductive layer 132 directly on the paddle peripheral portion 118.

The paddle central portion 116 and the paddle peripheral portion 118 can be at approximately the same level such that top extents of the paddle central portion 116 and the paddle peripheral portion 118 can be approximately coplanar with each other. The central conductive layer 128, the first selective conductive layer 130, and the second selective conductive layer 132 can be at approximately the same level such that top and bottom extents of the central conductive layer 128, the first selective conductive layer 130, and the second selective conductive layer 132 can be approximately coplanar with each other.

The paddle peripheral portion 118 can include a non-vertical surface 802, which is defined as a portion of the paddle peripheral portion 118 that vertically faces upward. The non-vertical surface 802 are not covered by the first selective conductive layer 130, the second selective conductive layer 132, and any other conductors directly on the paddle peripheral portion 118.

It has been discovered that the non-vertical surface 802 provides improved reliability since the non-vertical surface 802 is not covered by the first selective conductive layer 130 and the second selective conductive layer 132 thereby leaving surface areas for the encapsulation 158 to adhere thereto resulting in elimination of paddle detachment.

Figure 9:
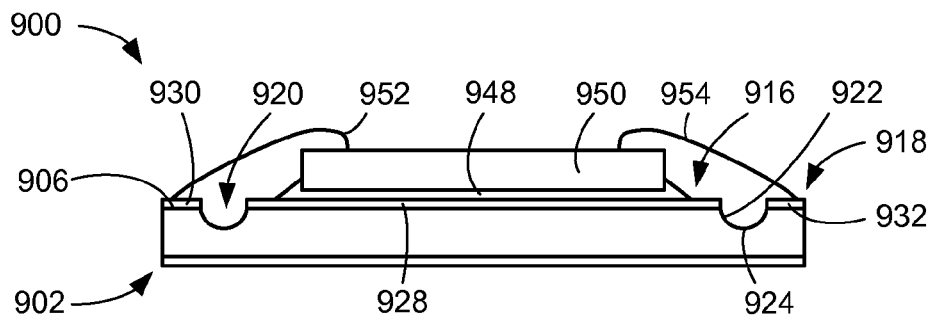
FIG. 9 is a cross-sectional view of an integrated circuit packaging system taken along line 9-9 of FIG. 11 in a second embodiment of the present invention.
Figure 11:
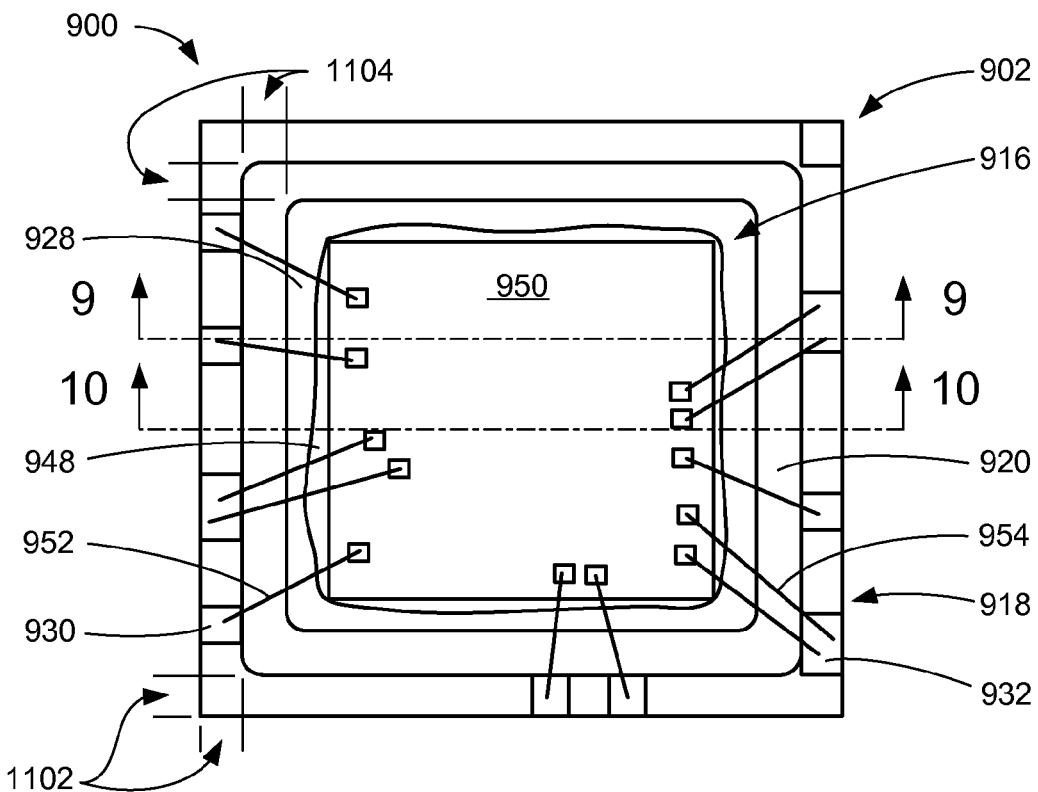
FIG. 11 is a top plan view of a portion of the integrated circuit packaging system.

Referring now to FIG. 9, therein is shown a cross-sectional view of an integrated circuit packaging system 900 taken along line 9-9 of FIG. 11 in a second embodiment of the present invention. The integrated circuit packaging system 900 is similar to the integrated circuit packaging system 100 of FIG. 1. In a manner similar to the integrated circuit packaging system 100, the integrated circuit packaging system 900 includes the encapsulation 158 of FIG. 1, even though the cross-sectional view is shown without the encapsulation 158.

In a manner similar to the integrated circuit packaging system 100, the integrated circuit packaging system 900 includes a package paddle 902 having a groove 920, a paddle top side 906, a paddle central portion 916, a paddle peripheral portion 918, a groove sidewall 922, and a groove bottom side 924. The package paddle 902 can optionally include a central conductive layer 928, a first selective conductive layer 930, and a second selective conductive layer 932.

In a manner similar to the integrated circuit packaging system 100, the integrated circuit packaging system 900 includes an attach layer 948 and an integrated circuit 950. The integrated circuit packaging system 900 optionally includes a first paddle-device connector 952 and a second paddle-device connector 954.

The cross-sectional view depicts the integrated circuit 950 mounted over the package paddle 902 with the attach layer 948 attached to the integrated circuit 950 and the paddle central portion 916. The integrated circuit 950 can be optionally attached to the central conductive layer 928 with the attach layer 948. The first paddle-device connector 952 and the second paddle-device connector 954 can be attached to the integrated circuit 950 and the first selective conductive layer 930 and the second selective conductive layer 932, respectively.

The groove 920 can be between the paddle central portion 916 and the paddle peripheral portion 918. The groove 920 can be between the central conductive layer 928 and the first selective conductive layer 930 and between the central conductive layer 928 and the second selective conductive layer 932. The groove 920 can be horizontally bounded by the groove sidewall 922 and vertically bounded by the groove bottom side 924. The groove sidewall 922 can include a curve or concave surface.

It has been discovered that the groove sidewall 922 having a curve or concave surface covered by the encapsulation 158 improves paddle interlocking resulting in improved reliability.

Figure 10:
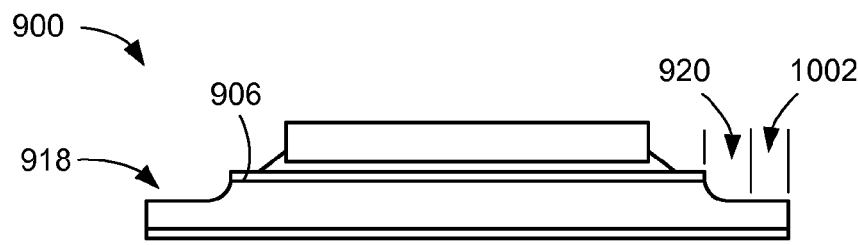
FIG. 10 is a cross-sectional view of the integrated circuit packaging system taken along line 10-10 of FIG. 11.

Referring now to FIG. 10, therein is shown a cross-sectional view of the integrated circuit packaging system 900 taken along line 10-10 of FIG. 11. The paddle peripheral portion 918 can include a recess 1002, which is defined as an indentation downwardly extending from the paddle top side 906 at the paddle peripheral portion 918. The recess 1002 can be between a perimeter of the paddle peripheral portion 918 and the groove 920.

Referring now to FIG. 11, therein is shown a top plan view of a portion of the integrated circuit packaging system 900. The top plan view is shown without the encapsulation 158 of FIG. 1.

The package paddle 902 can include the paddle central portion 916 surrounded by the paddle peripheral portion 918. The package paddle 902 can include the groove 920 between the paddle central portion 916 and the paddle peripheral portion 918.

The package paddle 902 can optionally include the central conductive layer 928 formed within a perimeter of the paddle central portion 916. The groove 920 can be formed around the perimeter of the central conductive layer 928. The package paddle 902 can optionally include the first selective conductive layer 930 and the second selective conductive layer 932 formed within a perimeter of the paddle peripheral portion 918.

The integrated circuit packaging system 900 can include the integrated circuit 950 attached to the paddle central portion 916 with the attach layer 948. The integrated circuit packaging system 900 can include the integrated circuit 950 optionally attached to the central conductive layer 928 with the attach layer 948.

The integrated circuit packaging system 900 can include the first paddle-device connector 952 and the second paddle-device connector 954, which can represent ground wires, connected or bonded to different plated segmented portions of the die paddle, depicted as the first selective conductive layer 930 and the second selective conductive layer 932.

The first selective conductive layer 930 and the second selective conductive layer 932 are formed to provide connection areas just for attaching the first paddle-device connector 952 and the second paddle-device connector 954 thereby leaving other surface areas of the paddle peripheral portion 918 exposed for the encapsulation 158 to form thereon. The first paddle-device connector 952 can be connected to the integrated circuit 950 and the first selective conductive layer 930.

The second paddle-device connector 954 can be connected to the integrated circuit 950 and the second selective conductive layer 932. Another of the second paddle-device connector 954 can be connected to the integrated circuit 950 and the second selective conductive layer 932.

The package paddle 902 can include the groove 920 upwardly exposing a material of the package paddle 902, which adheres well with a material of the encapsulation 158, in order to eliminate delamination or micro-gaps between the package paddle 902 and the encapsulation 158. For example, the package paddle 902 can represent a non-delaminating die paddle.

The first selective conductive layer 930 can be isolated and different from the second selective conductive layer 932. The first selective conductive layer 930 can include a length less than a length of the second selective conductive layer 932. The first selective conductive layer 930 can include a width approximately equal to a width of the second selective conductive layer 932. For illustrative purposes, the first selective conductive layer 930 and the second selective conductive layer 932 are shown as a square and a rectangle, respectively, although it is understood that the first selective conductive layer 930 and the second selective conductive layer 932 can include any other shapes.

The paddle peripheral portion 918 can include a peripheral width 1102, which is defined as a distance between an outer extent of the package paddle 902 and an outer extent of the groove 920. For example, the peripheral width 1102 can be approximately 0.2 millimeter (mm). The first selective conductive layer 930 and the second selective conductive layer 932 can include widths approximately equal to the peripheral width 1102.

The groove 920 can include a groove width 1104, which is defined as a distance between an inner extent of the paddle peripheral portion 918 and an outer extent of the paddle central portion 916. For example, the groove width 1104 can include an approximate range of 0.15 mm to 0.18 mm.

It has been discovered that the package paddle 902 improves reliability by providing additional surface areas within the groove 920 for the encapsulation 158 to form directly thereon free of delamination thereby eliminating paddle detachment since the package paddle 902 is formed with a material that adheres better to the encapsulation 158 than other conductors to the encapsulation 158.

It has been unexpectedly found that the package paddle 902 having the first selective conductive layer 930 and the second selective conductive layer 932 formed in multiple segments provides improved reliability since the first selective conductive layer 930 and the second selective conductive layer 932 are separate from each other leaving other surface areas of the paddle peripheral portion 918 exposed for the encapsulation 158 to form thereon thereby improving paddle interlocking.

Figure 12:
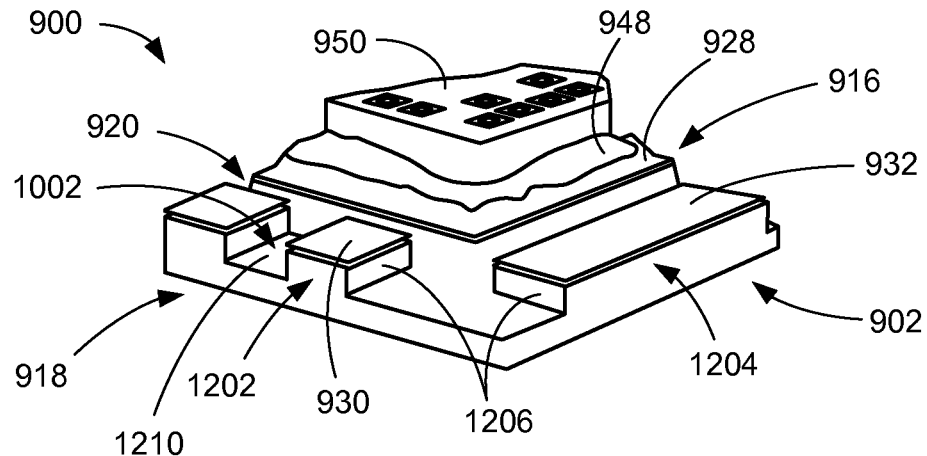
FIG. 12 is a top isometric view of a portion of the integrated circuit packaging system.

Referring now to FIG. 12, therein is shown a top isometric view of a portion of the integrated circuit packaging system 900. The top isometric view is shown without the encapsulation 158 of FIG. 1. The integrated circuit packaging system 900 is shown with the package paddle 902 having the paddle central portion 916 surrounded by the paddle peripheral portion 918 with the groove 920 between thereof.

The package paddle 902 can optionally include the central conductive layer 928 directly on the paddle central portion 916. The central conductive layer 928 can provide mounting support for the integrated circuit 950 attached thereto with the attach layer 948. The package paddle 902 can optionally include a number of the first selective conductive layer 930 and the second selective conductive layer 932 directly on the paddle peripheral portion 918.

The paddle central portion 916 and the paddle peripheral portion 918 can be at approximately the same level such that top extents of the paddle central portion 916 and the paddle peripheral portion 918 can be approximately coplanar with each other. The central conductive layer 928, the first selective conductive layer 930, and the second selective conductive layer 932 can be at approximately the same level such that top and bottom extents of the central conductive layer 928, the first selective conductive layer 930, and the second selective conductive layer 932 can be approximately coplanar with each other.

The paddle peripheral portion 918 can include a first peripheral segment 1202 and a second peripheral segment 1204, which are defined as portions of the paddle peripheral portion 918 that are separate from each other by the recess 1002. The first selective conductive layer 930 and the second selective conductive layer 932 can optionally be directly on the first peripheral segment 1202 and the second peripheral segment 1204, respectively.

The recess 1002 can be between a perimeter of the paddle peripheral portion 918 and the groove 920. The recess 1002 can include a recess bottom side 1210 coplanar with the groove bottom side 924 of FIG. 9.

Each of the first peripheral segment 1202 and the second peripheral segment 1204 can include segment non-horizontal sides 1206 vertically extending from the recess bottom side 1210 to a top extent of each of the first peripheral segment 1202 and the second peripheral segment 1204. Top extents of the first peripheral segment 1202 and the second peripheral segment 1204 can be coplanar with each other.

One of the segment non-horizontal sides 1206 of the first peripheral segment 1202 can be facing one of the segment non-horizontal sides 1206 of another of the first peripheral segment 1202. One of the segment non-horizontal sides 1206 of the first peripheral segment 1202 can be perpendicular to one of the segment non-horizontal sides 1206 of the second peripheral segment 1204. The recess 1002 can be horizontally bounded by one of the segment non-horizontal sides 1206 of the first peripheral segment 1202 facing one of the segment non-horizontal sides 1206 of another of the first peripheral segment 1202.

Optionally, the package paddle 902 can include castellation to prevent delamination of the encapsulation 158. Castellation can be represented by the package paddle 902 having the paddle peripheral portion 918 with the first peripheral segment 1202 and the second peripheral segment 1204 separated by the recess 1002.

It has been discovered that the recess bottom side 1210 and the segment non-horizontal sides 1206 provide improved reliability since the recess bottom side 1210 and the segment non-horizontal sides 1206 are not covered by the first selective conductive layer 930 and the second selective conductive layer 932 thereby leaving surface areas for the encapsulation 158 to adhere directly thereon resulting in elimination of paddle detachment.

It has been unexpectedly found that the first peripheral segment 1202 and the second peripheral segment 1204 optionally not covered by the first selective conductive layer 930 and the second selective conductive layer 932, respectively, provide improved reliability since the first peripheral segment 1202 and the second peripheral segment 1204 provide surface areas for the encapsulation 158 to adhere directly thereon resulting in elimination of paddle detachment.

Figure 13:
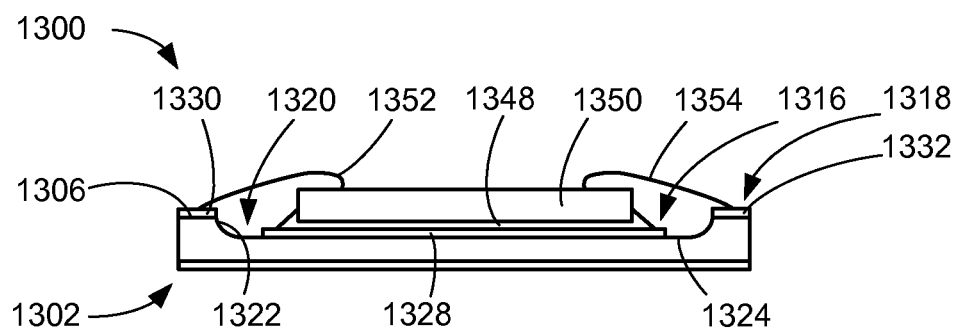
FIG. 13 is a cross-sectional view of an integrated circuit packaging system taken along line 13-13 of FIG. 15 in a third embodiment of the present invention.
Figure 15:
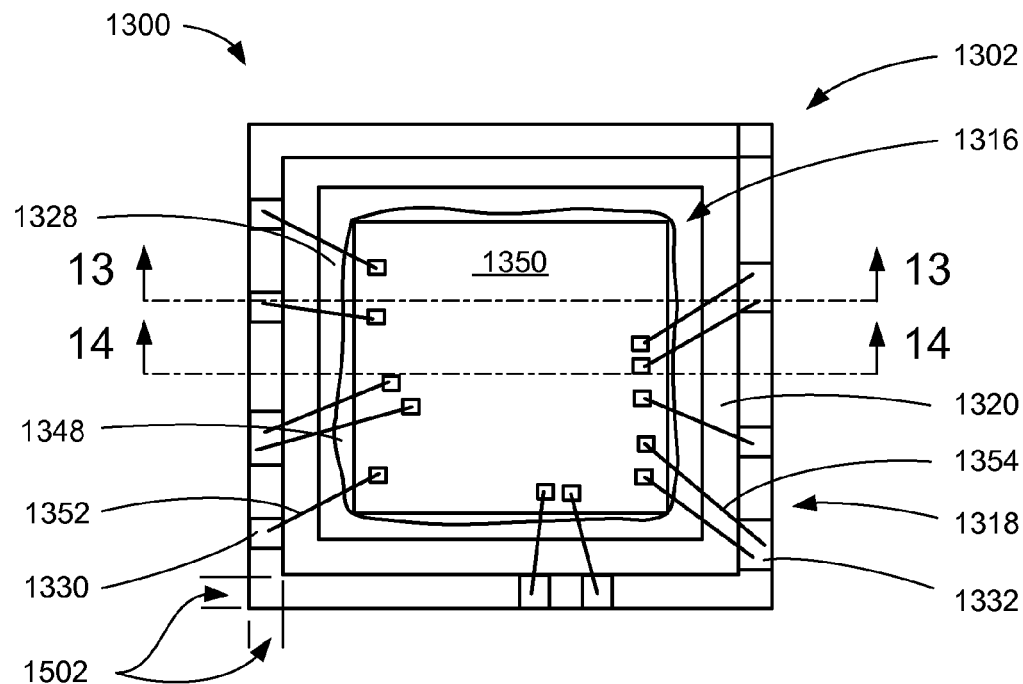
FIG. 15 is a top plan view of a portion of the integrated circuit packaging system.

Referring now to FIG. 13, therein is shown a cross-sectional view of an integrated circuit packaging system 1300 taken along line 13-13 of FIG. 15 in a third embodiment of the present invention. The integrated circuit packaging system 1300 is similar to the integrated circuit packaging system 100 of FIG. 1. In a manner similar to the integrated circuit packaging system 100, the integrated circuit packaging system 1300 includes the encapsulation 158 of FIG. 1, even though the cross-sectional view is shown without the encapsulation 158.

In a manner similar to the integrated circuit packaging system 100, the integrated circuit packaging system 1300 includes a package paddle 1302 having a groove 1320, a paddle top side 1306, a paddle central portion 1316, a paddle peripheral portion 1318, a groove sidewall 1322, and a groove bottom side 1324. The package paddle 1302 can optionally include a central conductive layer 1328, a first selective conductive layer 1330, and a second selective conductive layer 1332.

In a manner similar to the integrated circuit packaging system 100, the integrated circuit packaging system 1300 includes an attach layer 1348 and an integrated circuit 1350. The integrated circuit packaging system 1300 optionally includes a first paddle-device connector 1352 and a second paddle-device connector 1354.

The cross-sectional view depicts the integrated circuit 1350 mounted over the package paddle 1302 and within the groove 1320 with the attach layer 1348 attached to the integrated circuit 1350 and the paddle central portion 1316. The integrated circuit 1350 can be optionally attached to the central conductive layer 1328 within the groove 1320 with the attach layer 1348. The first paddle-device connector 1352 and the second paddle-device connector 1354 can be attached to the integrated circuit 1350 and the first selective conductive layer 1330 and the second selective conductive layer 1332, respectively.

The groove 1320 can be surrounded by the paddle peripheral portion 1318. The groove 1320 can be between the first selective conductive layer 1330 and the second selective conductive layer 1332. The groove 1320 can be horizontally bounded by the groove sidewall 1322 and vertically bounded by the groove bottom side 1324. The groove sidewall 1322 can include a curve or concave surface.

The central conductive layer 1328 can optionally extend from the groove sidewall 1322 to another of the groove sidewall 1322 opposite the groove sidewall 1322. In other words, the central conductive layer 1328 can optionally entirely cover the groove bottom side 1324 or a top side of the paddle central portion 1316.

It has been discovered that the groove sidewall 1322 having a curve or concave surface covered by the encapsulation 158 improves paddle interlocking resulting in improved reliability.

Figure 14:
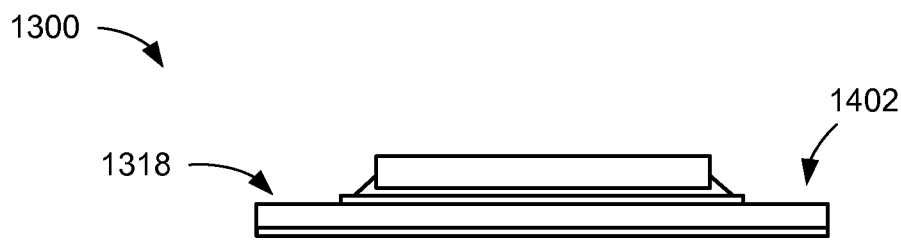
FIG. 14 is a cross-sectional view of the integrated circuit packaging system taken along line 14-14 of FIG. 15.

Referring now to FIG. 14, therein is shown a cross-sectional view of the integrated circuit packaging system 1300 taken along line 14-14 of FIG. 15. The paddle peripheral portion 1318 can include a recess 1402, which is defined as an indentation downwardly extending from the paddle top side 1306 of FIG. 13 at the paddle peripheral portion 1318. The recess 1402 can be between a perimeter of the paddle peripheral portion 1318 and the groove 1320 of FIG. 13.

Referring now to FIG. 15, therein is shown a top plan view of a portion of the integrated circuit packaging system 1300. The top plan view is shown without the encapsulation 158 of FIG. 1.

The package paddle 1302 can include the paddle central portion 1316 surrounded by the paddle peripheral portion 1318. The package paddle 1302 can include the groove 1320 surrounded by the paddle peripheral portion 1318.

The package paddle 1302 can optionally include the central conductive layer 1328 formed directly on the groove bottom side 1324 of FIG. 13. The package paddle 1302 can optionally include the first selective conductive layer 1330 and the second selective conductive layer 1332 formed within a perimeter of the paddle peripheral portion 1318.

The integrated circuit packaging system 1300 can include the integrated circuit 1350 attached to the paddle central portion 1316 with the attach layer 1348. The integrated circuit packaging system 1300 can include the integrated circuit 1350 optionally attached to the central conductive layer 1328 with the attach layer 1348.

The integrated circuit packaging system 1300 can include the first paddle-device connector 1352 and the second paddle-device connector 1354, which can represent ground wires, connected or bonded to different plated segmented portions of the die paddle, depicted as the first selective conductive layer 1330 and the second selective conductive layer 1332.

The first selective conductive layer 1330 and the second selective conductive layer 1332 are formed to provide connection areas just for attaching the first paddle-device connector 1352 and the second paddle-device connector 1354 thereby leaving other surface areas of the paddle peripheral portion 1318 exposed for the encapsulation 158 to form thereon. The first paddle-device connector 1352 can be connected to the integrated circuit 1350 and the first selective conductive layer 1330.

The second paddle-device connector 1354 can be connected to the integrated circuit 1350 and the second selective conductive layer 1332. Another of the second paddle-device connector 1354 can be connected to the integrated circuit 1350 and the second selective conductive layer 1332.

The package paddle 1302 can include the groove 1320 upwardly exposing a material of the package paddle 1302, which adheres well with a material of the encapsulation 158, in order to eliminate delamination or micro-gaps between the package paddle 1302 and the encapsulation 158. For example, the package paddle 1302 can represent a non-delaminating die paddle.

The first selective conductive layer 1330 can be isolated and different from the second selective conductive layer 1332. The first selective conductive layer 1330 can include a length less than a length of the second selective conductive layer 1332. The first selective conductive layer 1330 can include a width approximately equal to a width of the second selective conductive layer 1332. For illustrative purposes, the first selective conductive layer 1330 and the second selective conductive layer 1332 are shown as a square and a rectangle, respectively, although it is understood that the first selective conductive layer 1330 and the second selective conductive layer 1332 can include any other shapes.

The paddle peripheral portion 1318 can include a peripheral width 1502, which is defined as a distance between an outer extent of the package paddle 1302 and an outer extent of the groove 1320. For example, the peripheral width 1502 can be approximately 0.2 millimeter (mm). The first selective conductive layer 1330 and the second selective conductive layer 1332 can include widths approximately equal to the peripheral width 1502.

It has been discovered that the package paddle 1302 improves reliability by providing additional surface areas within the groove 1320 for the encapsulation 158 to form directly thereon free of delamination thereby eliminating paddle detachment since the package paddle 1302 is formed with a material that adheres better to the encapsulation 158 than other conductors to the encapsulation 158.

It has been unexpectedly found that the package paddle 1302 having the first selective conductive layer 1330 and the second selective conductive layer 1332 formed in multiple segments provides improved reliability since the first selective conductive layer 1330 and the second selective conductive layer 1332 are separate from each other leaving other surface areas of the paddle peripheral portion 1318 exposed for the encapsulation 158 to form thereon improves paddle interlocking.

Figure 16:
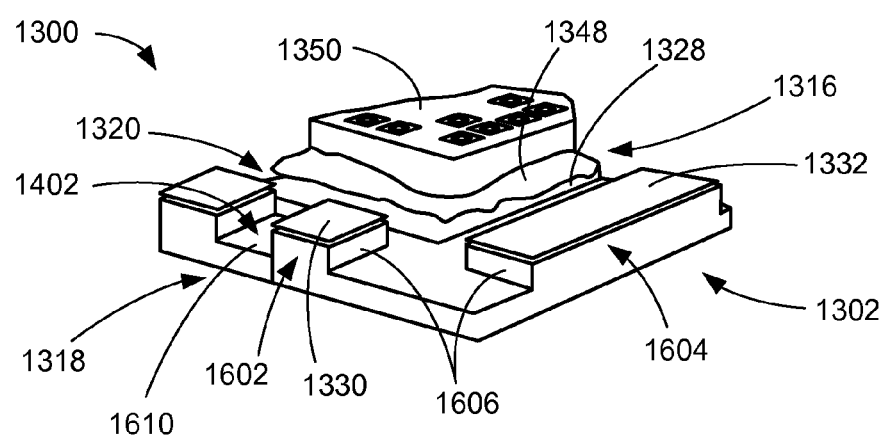
FIG. 16 is a top isometric view of a portion of the integrated circuit packaging system.

Referring now to FIG. 16, therein is shown a top isometric view of a portion of the integrated circuit packaging system 1300. The top isometric view is shown without the encapsulation 158 of FIG. 1. The integrated circuit packaging system 1300 is shown with the package paddle 1302 having the paddle central portion 1316 surrounded by the paddle peripheral portion 1318.

The package paddle 1302 can optionally include the central conductive layer 1328 directly on the groove bottom side 1324. The package paddle 1302 can optionally include a number of the first selective conductive layer 1330 and the second selective conductive layer 1332 directly on the paddle peripheral portion 1318.

The central conductive layer 1328 can optionally entirely cover the groove bottom side 1324. The central conductive layer 1328 can provide mounting support for the integrated circuit 1350 attached thereto with the attach layer 1348.

The paddle central portion 1316 can be below the paddle peripheral portion 1318. The groove bottom side 1324 defines a top side of the paddle central portion 1316. The central conductive layer 1328 can be below the first selective conductive layer 1330 and the second selective conductive layer 1332. The first selective conductive layer 1330 and the second selective conductive layer 1332 can be approximately coplanar with each other.

The paddle peripheral portion 1318 can include a first peripheral segment 1602 and a second peripheral segment 1604, which are defined as portions of the paddle peripheral portion 1318 that are separate from each other by the recess 1402. The first selective conductive layer 1330 and the second selective conductive layer 1332 can optionally be directly on the first peripheral segment 1602 and the second peripheral segment 1604, respectively.

The recess 1402 can be between a perimeter of the paddle peripheral portion 1318 and the groove 1320. The recess 1402 can include a recess bottom side 1610 coplanar with the groove bottom side 1324 of FIG. 13.

Each of the first peripheral segment 1602 and the second peripheral segment 1604 can include segment non-horizontal sides 1606 vertically extending from the recess bottom side 1610 to a top extent of each of the first peripheral segment 1602 and the second peripheral segment 1604. Top extents of the first peripheral segment 1602 and the second peripheral segment 1604 can be coplanar with each other.

One of the segment non-horizontal sides 1606 of the first peripheral segment 1602 can be facing one of the segment non-horizontal sides 1606 of another of the first peripheral segment 1602. One of the segment non-horizontal sides 1606 of the first peripheral segment 1602 can be perpendicular to one of the segment non-horizontal sides 1606 of the second peripheral segment 1604. The recess 1402 can be horizontally bounded by one of the segment non-horizontal sides 1606 of the first peripheral segment 1602 and one of the segment non-horizontal sides 1606 of another of the first peripheral segment 1602.

It has been discovered that the recess bottom side 1610 and the segment non-horizontal sides 1606 provide improved reliability since the recess bottom side 1610 and the segment non-horizontal sides 1606 are not covered by the first selective conductive layer 1330 and the second selective conductive layer 1332 thereby leaving surface areas for the encapsulation 158 to adhere thereto resulting in elimination of paddle detachment.

It has been unexpectedly found that the first peripheral segment 1602 and the second peripheral segment 1604 optionally not covered by the first selective conductive layer 1330 and the second selective conductive layer 1332, respectively, provide improved reliability since the first peripheral segment 1602 and the second peripheral segment 1604 provide surface areas for the encapsulation 158 to adhere thereto resulting in elimination of paddle detachment.

Figure 17:
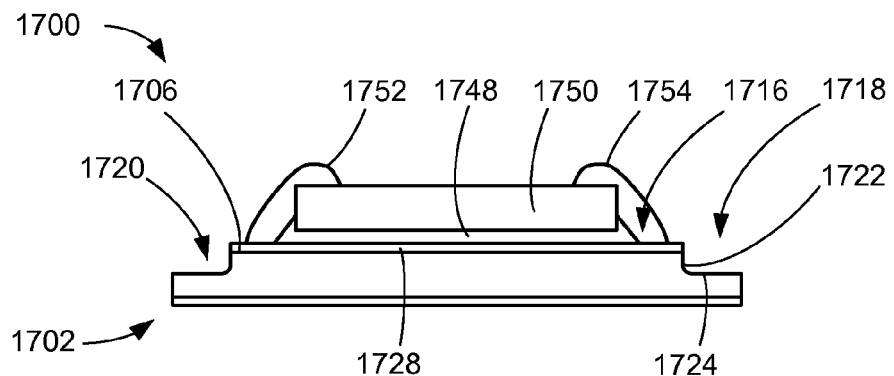
FIG. 17 is a cross-sectional view of an integrated circuit packaging system taken along line 17-17 of FIG. 18 in a fourth embodiment of the present invention.
Figure 18:
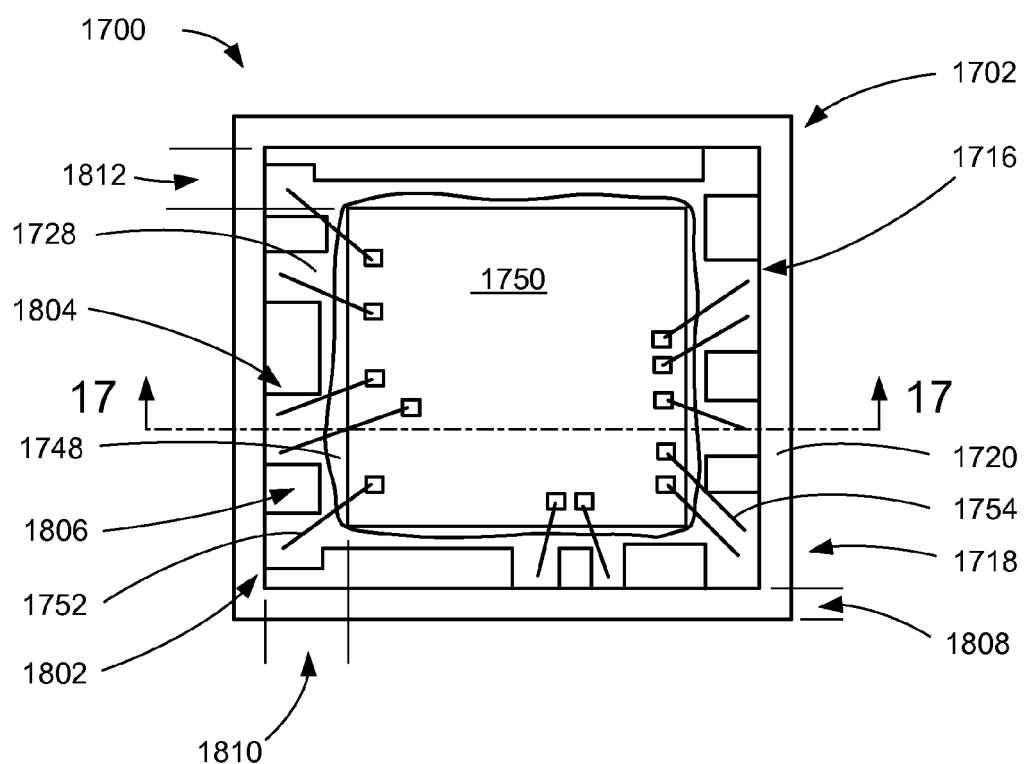
FIG. 18 is a top plan view of a portion of the integrated circuit packaging system.

Referring now to FIG. 17, therein is shown a cross-sectional view of an integrated circuit packaging system 1700 taken along line 17-17 of FIG. 18 in a fourth embodiment of the present invention. The integrated circuit packaging system 1700 is similar to the integrated circuit packaging system 100 of FIG. 1. In a manner similar to the integrated circuit packaging system 100, the integrated circuit packaging system 1700 includes the encapsulation 158 of FIG. 1, even though the cross-sectional view is shown without the encapsulation 158.

In a manner similar to the integrated circuit packaging system 100, the integrated circuit packaging system 1700 includes a package paddle 1702 having a groove 1720, a paddle top side 1706, a paddle central portion 1716, a paddle peripheral portion 1718, a groove sidewall 1722, a groove bottom side 1724, and a central conductive layer 1728. In a manner similar to the integrated circuit packaging system 100, the integrated circuit packaging system 1700 includes an attach layer 1748, an integrated circuit 1750, a first paddle-device connector 1752, and a second paddle-device connector 1754.

The cross-sectional view depicts the integrated circuit 1750 mounted over the package paddle 1702 with the attach layer 1748 attached to the integrated circuit 1750 and the central conductive layer 1728. The first paddle-device connector 1752 and the second paddle-device connector 1754 can be attached to the integrated circuit 1750 and the central conductive layer 1728.

The groove 1720 can be at the paddle peripheral portion 1718. The groove 1720 can extend from a periphery of the package paddle 1702 to the paddle central portion 1716. The groove 1720 can be horizontally bounded by the groove sidewall 1722 and vertically bounded by the groove bottom side 1724. The groove sidewall 1722 can include a curve or concave surface.

It has been discovered that the groove sidewall 1722 having a curve or concave surface covered by the encapsulation 158 improves paddle interlocking resulting in improved reliability.

It has been unexpectedly found that the groove bottom side 1724 provides improved reliability since the groove bottom side 1724 is at the paddle peripheral portion 1718 and thus not covered by the central conductive layer 1728 providing surface areas for the encapsulation 158 to form thereon thereby eliminating paddle detachment.

Referring now to FIG. 18, therein is shown a top plan view of a portion of the integrated circuit packaging system 1700. The top plan view is shown without the encapsulation 158 of FIG. 1.

The package paddle 1702 can include the paddle central portion 1716 surrounded by the paddle peripheral portion 1718. The package paddle 1702 can include the groove 1720 at the paddle peripheral portion 1718.

The package paddle 1702 can include the central conductive layer 1728 formed within a perimeter of the paddle central portion 1716. The groove 1720 can be formed around a perimeter of the central conductive layer 1728.

The central conductive layer 1728 can include a first central conductive segment 1802 and a second central conductive segment 1804, which are defined as portions of the central conductive layer 1728 that are separate from each other along a perimeter side of the central conductive layer 1728. The first central conductive segment 1802 and the second central conductive segment 1804 can be separated from each other with a central conductive layer recess 1806. The first central conductive segment 1802 and the second central conductive segment 1804 can be formed at a perimeter side of the central conductive layer 1728.

The integrated circuit packaging system 1700 can include the integrated circuit 1750 attached to the central conductive layer 1728 with the attach layer 1748. The integrated circuit packaging system 1700 can include the first paddle-device connector 1752 and the second paddle-device connector 1754, which can represent ground wires, connected or bonded to the first central conductive segment 1802 and the second central conductive segment 1804, respectively.

The first central conductive segment 1802 and the second central conductive segment 1804 are formed to provide connection areas just for attaching the first paddle-device connector 1752 and the second paddle-device connector 1754 thereby leaving other surface areas of the central conductive layer 1728 within the central conductive layer recess 1806 exposed for the encapsulation 158 to form thereon. The first paddle-device connector 1752 can be connected to the integrated circuit 1750 and the first central conductive segment 1802.

The second paddle-device connector 1754 can be connected to the integrated circuit 1750 and the second central conductive segment 1804. Another of the second paddle-device connector 1754 can be connected to the integrated circuit 1750 and the second central conductive segment 1804.

The package paddle 1702 can include the groove 1720 and the central conductive layer recess 1806 upwardly exposing a material of the package paddle 1702, which adheres well with a material of the encapsulation 158, in order to eliminate delamination or micro-gaps between the package paddle 1702 and the encapsulation 158. For example, the package paddle 1702 can represent a non-delaminating die paddle.

The first central conductive segment 1802 can include a length less than a length of the second central conductive segment 1804. For illustrative purposes, the first central conductive segment 1802 and the second central conductive segment 1804 are shown as a square and a rectangle, respectively, although it is understood that the first central conductive segment 1802 and the second central conductive segment 1804 can include any other shapes.

The paddle peripheral portion 1718 can include a peripheral width 1808, which is defined as a distance between an outer extent of the package paddle 1702 and an outer extent of the paddle central portion 1716. The groove 1720 can include a width approximately equal to the peripheral width 1808. For example, the peripheral width 1808 can include an approximate range of 0.2 mm to 0.3 mm.

The package paddle can include a horizontal edge-to-edge length 1810, which is defined as a distance from a vertical side of the integrated circuit 1750 to a vertical side of the paddle central portion 1716. For example, the horizontal edge-to-edge length 1810 can include an approximate range of 0.413 mm to 0.513 mm.

The package paddle can include a vertical edge-to-edge length 1812, which is defined as a distance from a horizontal side of the integrated circuit 1750 to a horizontal side of the paddle central portion 1716. For example, the vertical edge-to-edge length 1812 can include an approximate range of 0.303 mm to 0.403 mm.

It has been discovered that the package paddle 1702 improves reliability by providing additional surface areas within the groove 1720 and the central conductive layer recess 1806 for the encapsulation 158 to form directly thereon free of delamination thereby eliminating paddle detachment since the package paddle 1702 is formed with a material that adheres better to the encapsulation 158 than other conductors to the encapsulation 158.

It has been unexpectedly found that the central conductive layer 1728 having the first central conductive segment 1802 and the second central conductive segment 1804 formed in multiple segments provides improved reliability since the first central conductive segment 1802 and the second central conductive segment 1804 are separate from each other with the central conductive layer recess 1806 in between leaving other surface areas of the central conductive layer 1728 exposed for the encapsulation 158 to form thereon.

Figure 19:
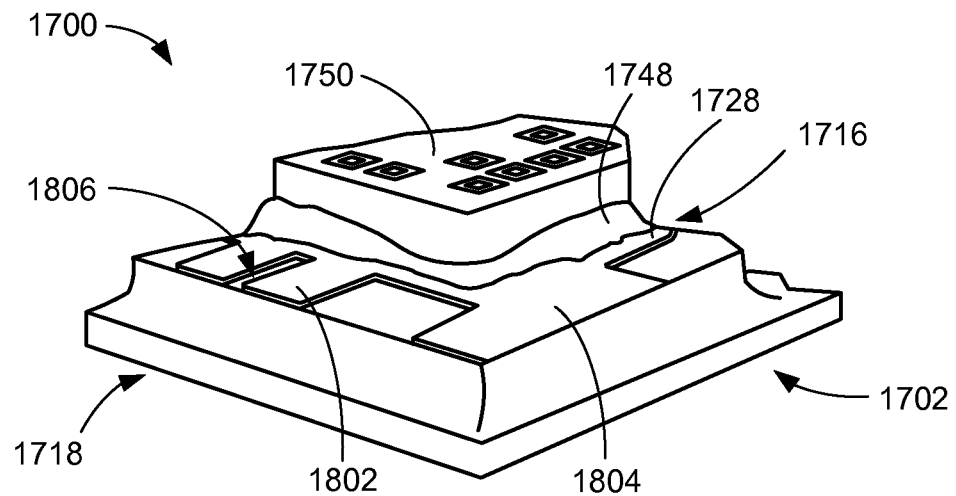
FIG. 19 is a top isometric view of a portion of the integrated circuit packaging system.

Referring now to FIG. 19, therein is shown a top isometric view of a portion of the integrated circuit packaging system 1700. The top isometric view is shown without the encapsulation 158 of FIG. 1. The integrated circuit packaging system 1700 is shown with the package paddle 1702 having the paddle central portion 1716 surrounded by the paddle peripheral portion 1718.

The package paddle 1702 can include the central conductive layer 1728 directly on the paddle central portion 1716. The central conductive layer 1728 can provide mounting support for the integrated circuit 1750 attached thereto with the attach layer 1748. The central conductive layer 1728 can include a number of the first central conductive segment 1802 and the second central conductive segment 1804 partially separated by the central conductive layer recess 1806.

Embodiments of the present invention amplify copper (Cu) exposure and some variations employing segmented groove for areas that interface with the encapsulation 158 as added anchor effect.

Figure 20:
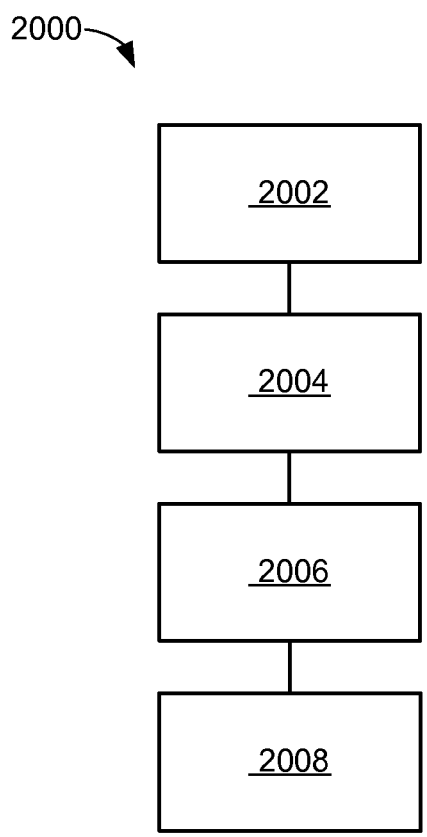
FIG. 20 is a flow chart of a method of manufacture of the integrated circuit packaging system in a further embodiment of the present invention.

Referring now to FIG. 20, therein is shown a flow chart of a method 2000 of manufacture of the integrated circuit packaging system in a further embodiment of the present invention. The method 2000 includes: providing a package paddle having a single integral structure with a paddle central portion surrounded by a paddle peripheral portion in a block 2002; forming a terminal adjacent the package paddle in a block 2004; mounting an integrated circuit over the paddle central portion in a block 2006; and forming an encapsulation over the integrated circuit and the terminal, the encapsulation free of delamination with the encapsulation directly on the paddle peripheral portion in a block 2008.

Thus, it has been discovered that the integrated circuit packaging system of the present invention furnishes important and heretofore unknown and unavailable solutions, capabilities, and functional aspects for an integrated circuit packaging system with a die paddle. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:

providing a package paddle having a single integral structure with a paddle central portion surrounded by a paddle peripheral portion;
forming a groove between the paddle central portion and the paddle peripheral portion, the groove being horizontally bound by a groove sidewall and vertically bound by a groove bottom side;
forming a recess between a perimeter of the groove and the paddle peripheral portion, the recess having a recess bottom side that is coplanar with the groove bottom side;
forming a terminal adjacent the package paddle;
mounting an integrated circuit over the paddle central portion; and
forming an encapsulation over the integrated circuit and the terminal, the encapsulation free of delamination with the encapsulation directly on the paddle peripheral portion.

2. The method as claimed in claim 1 wherein:
forming the encapsulation includes forming the encapsulation within the groove.

3. The method as claimed in claim 1 wherein:
providing the package paddle includes providing the package paddle having a selective conductive layer at the paddle peripheral portion; and
further comprising:
attaching a paddle-device connector to the selective conductive layer and the integrated circuit.

4. The method as claimed in claim 1 wherein providing the package paddle includes providing the package paddle having the paddle central portion coplanar with the paddle peripheral portion.

5. The method as claimed in claim 1 wherein:
forming the encapsulation includes forming the encapsulation directly on the recess bottom side.

6. A method of manufacture of an integrated circuit packaging system comprising:
providing a package paddle having a single integral structure with a paddle central portion surrounded by a paddle peripheral portion;
forming a groove between the paddle central portion and the paddle peripheral portion, the groove being horizontally bound by a groove sidewall and vertically bound by a groove bottom side;
forming a recess between a perimeter of the groove and the paddle peripheral portion the recess having a recess bottom side that is coplanar with the groove bottom side;
forming a terminal adjacent the package paddle;
mounting an integrated circuit over the paddle central portion;
connecting a terminal-device connector to the integrated circuit and the terminal; and
forming an encapsulation over the integrated circuit and the terminal, the encapsulation free of delamination with the encapsulation directly on the paddle peripheral portion.

7. The method as claimed in claim 6 wherein:
providing the package paddle includes providing the package paddle having the paddle peripheral portion with a peripheral segment; and
forming the encapsulation includes forming the encapsulation directly on the peripheral segment.

8. The method as claimed in claim 6 wherein providing the package paddle includes providing the package paddle having the paddle central portion below the paddle peripheral portion.

9. The method as claimed in claim 6 wherein providing the package paddle includes providing the package paddle having a central conductive layer entirely covering the paddle central portion.

10. The method as claimed in claim 6 wherein providing the package paddle includes providing the package paddle having a central conductive layer with a first central conductive segment separate from a second central conductive segment.

11. An integrated circuit packaging system comprising:
a package paddle having a single integral structure with a paddle central portion surrounded by a paddle peripheral portion;
a groove between the paddle central portion and the paddle peripheral portion, the groove being horizontally bound by a groove sidewall and vertically bound by a groove bottom side;
a recess between a perimeter of the groove and the paddle peripheral portion, the recess having a recess bottom side that is coplanar with the groove bottom side;
a terminal adjacent the package paddle;
an integrated circuit over the paddle central portion; and
an encapsulation over the integrated circuit and the terminal, the encapsulation free of delamination with the encapsulation directly on the paddle peripheral portion.

12. The system as claimed in claim 11 wherein:
the encapsulation is within the groove.

13. The system as claimed in claim 11 wherein:
the package paddle includes a selective conductive layer at the paddle peripheral portion; and
further comprising:
a paddle-device connector attached to the selective conductive layer and the integrated circuit.

14. The system as claimed in claim 11 wherein the package paddle includes the paddle central portion coplanar with the paddle peripheral portion.

15. The system as claimed in claim 11 wherein:
the encapsulation is directly on the recess bottom side.

16. The system as claimed in claim 11 further comprising a terminal-device connector connected to the integrated circuit and the terminal.

17. The system as claimed in claim 16 wherein:
the package paddle includes the paddle peripheral portion with a peripheral segment; and
the encapsulation is directly on the peripheral segment.

18. The system as claimed in claim 16 wherein the package paddle includes the paddle central portion below the paddle peripheral portion.

19. The system as claimed in claim 16 wherein the package paddle includes a central conductive layer entirely covering the paddle central portion.

20. The system as claimed in claim 16 wherein the package paddle includes a central conductive layer with a first central conductive segment separate from a second central conductive segment.

* * * * *